United States Patent
Song et al.

(10) Patent No.: US 7,960,235 B1
(45) Date of Patent: Jun. 14, 2011

(54) METHOD FOR MANUFACTURING A MOSFET WITH A SURROUNDING GATE OF BULK SI

(75) Inventors: Yi Song, Beijing (CN); Huajie Zhou, Beijing (CN); Qiuxia Xu, Beijing (CN)

(73) Assignee: Institute of Microelectronics, Chinese Academy (CN)

( * ) Notice: Subject to any disclaimer, the term of this patent is extended or adjusted under 35 U.S.C. 154(b) by 0 days.

(21) Appl. No.: 12/912,531

(22) Filed: Oct. 26, 2010

(30) Foreign Application Priority Data

Dec. 24, 2009 (CN) .......................... 2009 1 0243780

(51) Int. Cl.
*H01L 21/336* (2006.01)

(52) U.S. Cl. ........ 438/287; 438/745; 438/694; 438/243; 438/682; 977/938; 977/762

(58) Field of Classification Search .................. 438/287, 438/243, 682, 745, 694; 977/938, 762
See application file for complete search history.

(56) References Cited

U.S. PATENT DOCUMENTS 7,749,905 B2 *  7/2010  Cohen et al. .................. 438/682
7,816,275 B1 * 10/2010  Fuller et al. ................... 438/745

\* cited by examiner

*Primary Examiner* — Matthew S Smith
*Assistant Examiner* — Wilner Jean Baptiste
(74) *Attorney, Agent, or Firm* — Schwegman, Lundberg & Woessner, P.A.

(57) ABSTRACT

A method for manufacturing a bulk Si nanometer surrounding-gate MOSFET based on a quasi-planar process, including: local oxidation isolation or shallow trench isolation; depositing buffer $SiO_2$ oxide layer/SiN dielectric layer on the bulk Si; electron beam exposure; etching two adjacent slots; depositing SiN sidewalls; isotropically etching Si; dry oxidation; removing SiN by wet etching; forming the nanowire by stress self-constraint oxidation; depositing and anisotropically etching oxide dielectric layer and planarizing surface; releasing the nanowire by wet etching while keeping sufficiently thick $SiO_2$ at bottom as isolation; growing gate dielectric and depositing gate material; etching back the gate and isotropically etching the gate material by using the gate dielectric as a block layer; shallow implantation in the source/drain region; depositing and etching sidewalls; deep implantation in the source/drain region to form contact. The present invention eliminates self-heating effect and floating-body effect, and is easy to integrate. The present invention is also advantageous in suppression of short channel effect and enables the size of the MOSFET to be smaller.

10 Claims, 6 Drawing Sheets

METHOD FOR MANUFACTURING A MOSFET WITH A SURROUNDING GATE OF BULK SI

PRIORITY APPLICATION(S)

This patent application is a continuation of prior International Number PCT/CN2010/074699, filed Jun. 29, 2010; which international patent application claims the benefit of priority, under 35 U.S.C. §119, to Chinese Patent Application Serial Number 200910243780.1, filed Dec. 24, 2009, the entire contents of which are incorporated herein by reference in their entirety.

FIELD OF THE INVENTION

The invention relates to a technical field of a microelectronic nanometer-scale Complementary Metal Oxide Semiconductor (CMOS) device and Very Large Scale Integrated Circuits, and in particular, to a method for manufacturing a bulk Si surrounding gate Metal Oxide Semiconductor Field Effect Transistor (MOSFET) based on quasi-planar process.

DESCRIPTION OF THE PRIOR ART

Nanometer CMOS devices are developed according the Moore Rule. As the continuous scaling of the size of a planar bulk Si device has encountered a serious challenge, various devices with new structures have been developed. The gate structure of the device has been developed from the initial single-gate structure to the double-gate structure and the triple-gate structure, until the surrounding-gate structure that completely surrounds the channel. The abilities of gate control and short channel effect suppression continue to increase as the number of gate becomes larger. The nanowire surrounding gate MOSFET having a structure surrounding the channel and a quasi-ballistic transport characteristic has become a strong competitor for the technical node of the Roadmap for the IC technology at 22 nm and beyond, due to the strong ability of gate control and scaling of size.

There have been both domestic and abroad reports about the primary success in manufacturing the nanowire surrounding gate MOSFET. The nanowire surrounding gate structure shows a nearly ideal ability of short channel effect suppression as well as excellent driving performance and off-state characteristic. As the SOI substrate has a built-in BOX oxide layer as the sacrificing layer, manufacture of the surrounding-gate structure becomes easier. Therefore, it is typical to manufacture the surrounding-gate structure by using the SOI substrate. However, the bulk Si substrate has many great advantages over the SOI substrate:

1) The bulk Si substrate does not have the self-heating effect and floating-body effect in the SOI substrate;
2) The bulk Si substrate does not need the complex source/drain engineering to reduce the source/drain parasite resistance;
3) The common bulk Si is much cheaper than the SOI wafer; and
4) The process is completely compatible with the conventional bulk Si process.

The main difficulty in manufacturing surrounding-gate devices on the bulk Si is to form the sacrificing layer. The currently few reports on the manufacturing method based on the bulk Si substrate either need the Damascus replaced gate, which uses complex and expensive SiGe epitaxy as the sacrificing layer, or directly perform isotropic etching on the Si, which causes contamination of the substrate. Further, large parasite capacitance and resistance are inevitable. It is more serious that the complex three-dimensional process greatly increases the difficulty of manufacture, and thus the exiting mainstream planar process may not be adapted. All these are obviously disadvantageous and limit further scaling of size.

There are many problems to be solve in manufacturing the bulk Si surrounding-gate nanowire MOSFET. Multiple factors should be considered when a specific implementing solution is chosen, such as:

1) Good compatibility with the CMOS process. Uncertainty of process and increase of process difficulty should be avoided as much as possible. If the quasi-planar process is adopted, the existing planar process can be of a reference, in order to greatly lower down the risk and Uncertainty of process.
2) Simplicity, reliability, and repeatability of the process. The simplicity of process is critical to improve the finished product rate. The roughness of the line edge and the non-uniformity of the film thickness should be lowered down, in order to reduce the effect of process variations on the device performance as much as possible.
3) Ability of further scaling of the size.

It is necessary to find a new method for manufacturing the bulk Si nanometer surrounding-gate MOSFET that is easy to be integrated into the planar CMOS process.

SUMMARY OF THE INVENTION

The present invention provides a method for manufacturing the bulk Si surrounding-gate MOSFET that is easy to be integrated and well compatible with the planar CMOS process.

The present provides a method for manufacturing the bulk Si nanometer surrounding-gate MOSFET based on the quasi-planar process, including:

1) forming an N well and a P well;
2) performing field region photolithography, field region implantation, and local oxidation isolation or shallow trench isolation;
3) depositing a buffer $SiO_2$ oxide layer/SiN dielectric layer;
4) performing positive electron beam exposure, and etching the dielectric layer to form slots;
5) depositing a buffer $SiO_2$ oxide layer and SiN, and etching to form sidewalls;
6) isotropically etching Si;
7) performing a first dry oxidation step;
8) removing remaining SiN by wet etching;
9) performing a second dry oxidation step to form nanowire;
10) depositing and anisotropically etching tetraethyl orthosilicate, or depositing oxide at a low temperature, and then planarizing surface;
11) isotropically releasing the nanowire by wet etching;
12) depositing gate dielectric;
13) depositing gate electrode material;
14) anisotropically etching the gate electrode;
15) isotropically etching the gate electrode;
16) implanting in source and drain extension regions;
17) isotropically depositing SiN and anisotropically etching it to form sidewalls;
18) performing deep implantation in source and drain regions;
19) forming silicide; and
20) metalizing.

In step 3) of the method, a thickness of the deposited buffer SiO$_2$ oxide layer is 5-50 nm, and a thickness of the deposited SiN is 20-800 nm.

In step 4) of the method, the positive electron beam exposure is performed by using positive electron beam photoresist; adjacent dielectric slots are etched by fluorin-base reactive ion etching; and adjacent Si slots are etched by chlorine-base reactive ion etching.

In step 5) of the method, a thickness of the deposited buffer oxide layer is 5-15 nm, and a thickness of the SiN is 20-80 nm, and they are etched to form the sidewalls.

In step 6) of the method, the Si is isotropically etched to a depth of 20-80 nm.

In step 7) of the method, a thickness of dry oxidation is 40-100 nm. In step 9) of the method, a thickness of dry oxidation is 10-60 nm.

In step 10) of the method, a thickness of the thick tetraethyl orthosilicate that is deposited and anisotropically etched or the oxide that is deposited at the low temperature is 100 nm-2000 nm.

In step 12) of the method, an equivalent oxide layer thickness of the gate dielectric is 6-40 Å. The gate dielectric is SiON, HfON, HfAlO, HfAlON, HfTaO, HfTaON, HfSiO, HfSiON, HfLaO, or HfLaON. The gate dielectric layer can be formed by low pressure chemical vapor deposition, physical vapor deposition, metal organic chemical vapor deposition or atom layer deposition.

In step 13) of the method, the gate electrode material is W, Ti, Ta, Mo, TiN, TaN, HfN, or MoN. The gate electrode material can be formed by low pressure chemical vapor deposition, metal organic chemical vapor deposition or atom layer deposition, and a thickness thereof is 1000-2000 Å.

In step 15) of the method, the gate material is isotropically etched with a gate dielectric layer as a hard mask, and a lateral depth of etching is 10-150 nm.

The present invention eliminates self-heating effect and float-body effect, and has a low cost. It is well compatible with CMOS planar process by completely adopting conventional top-down process based on quasi-planar process. It is easy to integrate, and advantageous in suppression of short channel effect. It enables the size of MOSFET to become smaller.

BRIEF DESCRIPTION OF THE DRAWINGS

FIGS. 1(a)-(j) show steps of the method for manufacturing suspended nanowire, wherein:

FIG. 1(a) shows depositing of pre-oxide/SiN dielectric layer;

FIG. 1(b) shows positive electron beam exposure and etching of two slots;

FIG. 1(c) shows the thickness of the buffer oxidation layer deposited by chemical vapor deposition and SiN;

FIG. 1(d) shows anisotropically etching of SiO$_2$/SiN stack to form sidewalls;

FIG. 1(e) shows anisotropically etching of Si;

FIG. 1(f) shows the first dry oxidation;

FIG. 1(g) shows removing of SiN by wet isotropically etching;

FIG. 1(h) shows the second dry oxidation, wherein the nanowire is formed by stress constraint function;

FIG. 1(i) shows isotropically depositing and etching of oxide (TEOS or LTO) dielectric layer, and planarizing of the surface;

FIG. 1(j) shows releasing of the nanowire by wet etching the oxide; and

Figure 1A:
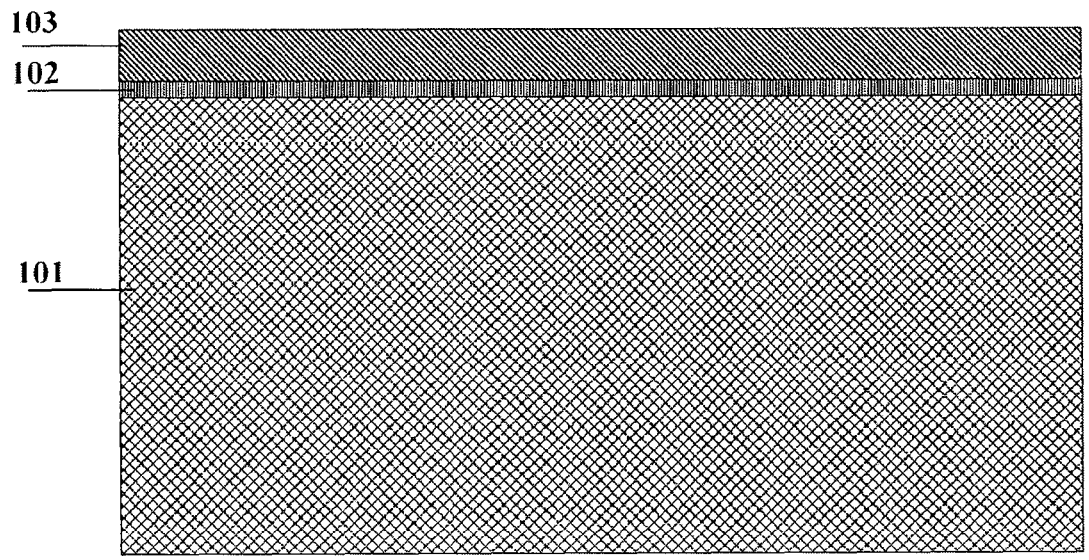

Reference signs in the drawings:

101 Si substrate;
102 buffer SiO$_2$ oxide layer;
103 SiN dielectric layer;
104 two adjacent slots;
105 SiN sidewall;
106 sidewall buffer SiO$_2$ oxide layer;
107 SiO$_2$ oxide layer of the first oxidation;
108 SiO$_2$ oxide layer of the second oxidation;
109 Si nanowire;
110 oxide (TEOS or LTO) dielectric layer;
201 layout of active region;
202 layout of adjacent slots;
203 layout of gate; and
204 layout of contact.

DETAILED DESCRIPTION OF THE PREFERRED EMBODIMENTS

The steps of the method according to the present invention are as follows:

1) performing double-well process and driving the dopants into the substrate;
2) forming LOCal Oxidation of Silicon (LOCOS) isolation or Shallow Trench Isolation (STI);
3) depositing a buffer SiO$_2$ oxide layer/SiN dielectric layer;
4) performing positive electron beam exposure, and etching to form slots;
5) isotropically depositing a buffer SiO$_2$ oxide layer and a SiN film, and anisotropically etching them to form sidewalls;
6) isotropically etching Si;
7) performing a first dry oxidation;
8) performing wet isotropic etching of SiN;
9) performing a second dry oxidation to form a nanowire;
10) depositing and anisotropically etching an oxide (TEOS or LTO) dielectric layer, and then planarizing the surface;
11) performing isotropic wet etching to release the nanowire;
12) depositing a gate dielectric;
13) depositing a gate electrode material;
14) performing electron beam photolithography on an oxide hard mask; and anisotropically etching the gate electrode;
15) isotropically etching the gate electrode;
16) performing shallow implanting in source and drain extension regions;
17) isotropically depositing SiN and anisotropically etching it to form sidewalls;
18) performing deep implantation in source and drain regions;
19) forming silicide; and
20) performing metalizing.

In step 1), the N well is implanted with $^+P^{31}$, and the P well is implanted with $^+B^{11}$. The depth of the wells is 1-2 μm.

In step 2), the thickness of the isolation layer of the LOCOS isolation or the STI is 4000-6000 Å.

In step 3), the thickness of the buffer SiO$_2$ oxide layer is 5-50 nm, and the thickness of the deposited SiN is 20-800 nm.

In step 4), the positive electron beam exposure is performed by using positive electron beam photoresist. The adjacent dielectric slots are etched by fluorin-base reactive ion etching. The adjacent Si slots are etched by chlorine-base reactive ion etching.

In step 5), the thickness of the deposited buffer oxide layer is 5-15 nm, and the thickness of the SiN is 20-80 nm, and they are etched to form the sidewalls.

In step 6), the depth of the isotropically etched Si is 20-80 nm.

In step 7), the thickness of the dry oxidation is 40-100 nm.

In step 8), all SiN is removed by wet etching.

In step 9), the thickness of the dry oxidation is 10-60 nm.

In step 10), the oxide (TEOS or LTO) dielectric layer is deposited and anisotropically etched, and then the surface is planarized.

In step 11), the nanowire is released by isotropically etching the oxide.

In step 12), the equivalent oxide layer thickness of the gate dielectric is 6-40 Å. The gate dielectric can be SiON, HfON, HfAlO, HfAlON, HfTaO, HfTaON, HfSiO, HfSiON, HfLaO, or HfLaON. The gate dielectric layer can be formed by low pressure chemical vapor deposition, physical vapor deposition, metal organic chemical vapor deposition or atom layer deposition.

In step 13), the gate electrode material can be polysilicon and metal gate material (such as refractory metal W, Ti, Ta, or Mo, and metal nitride TiN, TaN, HfN, or MoN, etc.). The gate electrode material can be formed by low pressure chemical vapor deposition, metal organic chemical vapor deposition or atom layer deposition, and a thickness thereof is 1000-2000 Å.

In step 14), electron beam photolithography is performed on the oxide hard mask, and the oxide layer is used as the hard mask to anisotropically etching the gate material. The lateral depth of etching is 100-200 nm.

In step 15), the gate material is isotropically etched with a gate dielectric layer as a hard mask, and the lateral depth of etching is 10-150 nm.

In step 16), the implantation in the source and drain extension regions is low-energy implantation.

In step 17), the SiN is isotropically deposited and the thickness of the sidewalls formed by anisotropically etching is 10-50 nm.

In step 18), As is implanted into the source and drain regions for nMOSFET; and $BF_2$ is implanted into the source and drain regions for pMOSFET.

In step 19), the silicide is NiSi or other metal silicide, which is formed by sputtering metals such as Ni followed by two-step rapid thermal anneal.

In step 20), multiple metal layers Ti/TiN/Al—Si/TiN are used in the metallization, which are etched after photolithography to form lead contact, and then are alloyed.

Next, further explanation is given with reference to the drawings.

EMBODIMENTS

1) In performing the double-well process and driving the dopants into the substrate, the $N^+$ well is formed by implanting $^+P^{31}$ into the Si substrate (101) with the energy of 110-150 KeV and the dose of (1-2)e13. The $P^+$ well is formed by implant $^+B^{11}$ into the Si substrate (101) with the energy of 110-150 KeV and the dose of (1-2)e13. Proceeding is performed such that the depth of the wells is 1-2 µm.

2) In-plane LOCal Oxidation of Silicon (LOCOS) isolation is formed, and field oxide is grown at a temperature of 1000° C. to have a thickness of 3000-5000 Å; or shallow trench isolation (STI) is formed.

3) As shown in FIG. 1(a), the buffer $SiO_2$ oxide layer (102) is thermally grown to a thickness of 15 nm/SiN (103) is deposited to a thickness of 50 nm by chemical vapor deposition.

Figure 1B:
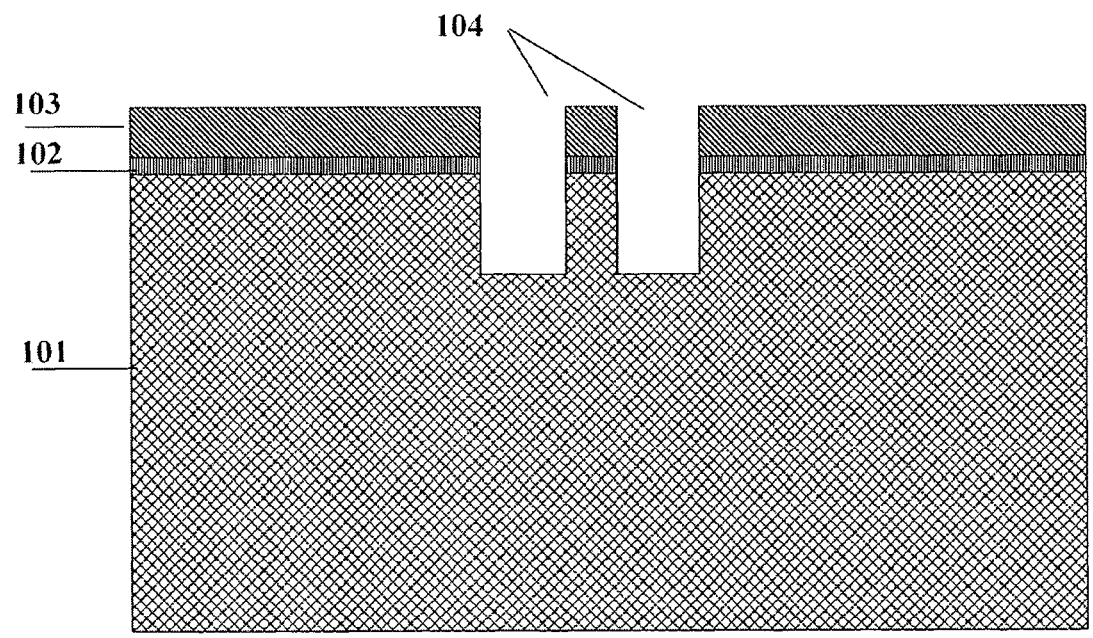

4) As shown in FIG. 1(b), positive electron beam exposure is performed, and two adjacent sharp straight slots (104) are etched, with a width of 400 nm×400 nm, and a space therebetween of 50 nm.

Figure 1C:
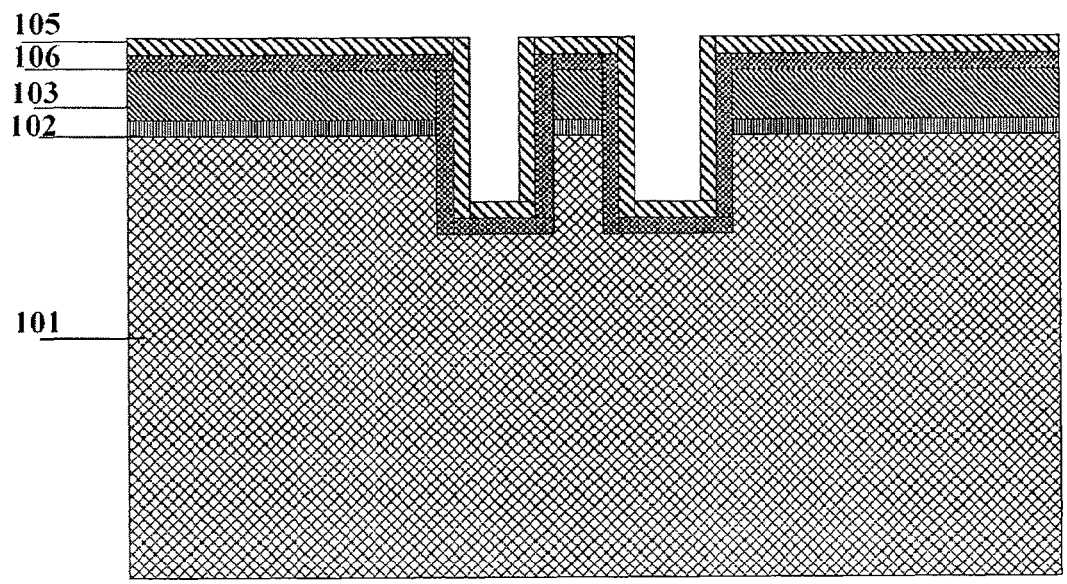
Figure 1D:
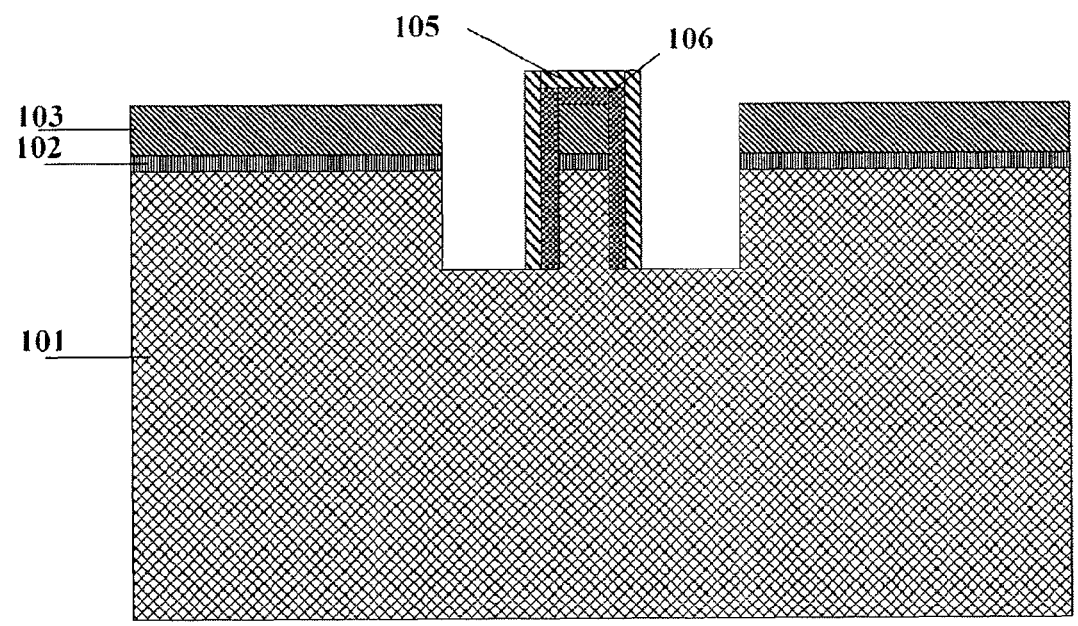

5) As shown in FIG. 1(c) and FIG. 1(d), the thickness of the buffer oxide layer deposited by chemical vapor deposition is 10 nm (106), and the thickness of SiN is 50 nm (105), and then they are etched to form the sidewalls.

Figure 1E:
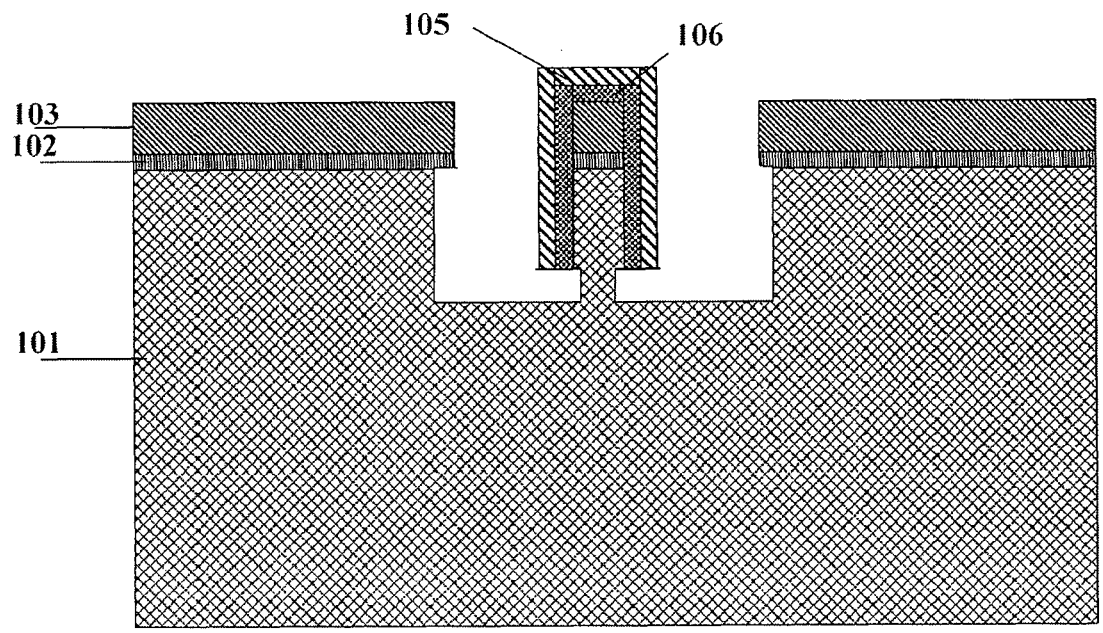

6) As shown in FIG. 1(e), the depth of the isotropically etched Si is 20-80 nm.

Figure 1F:
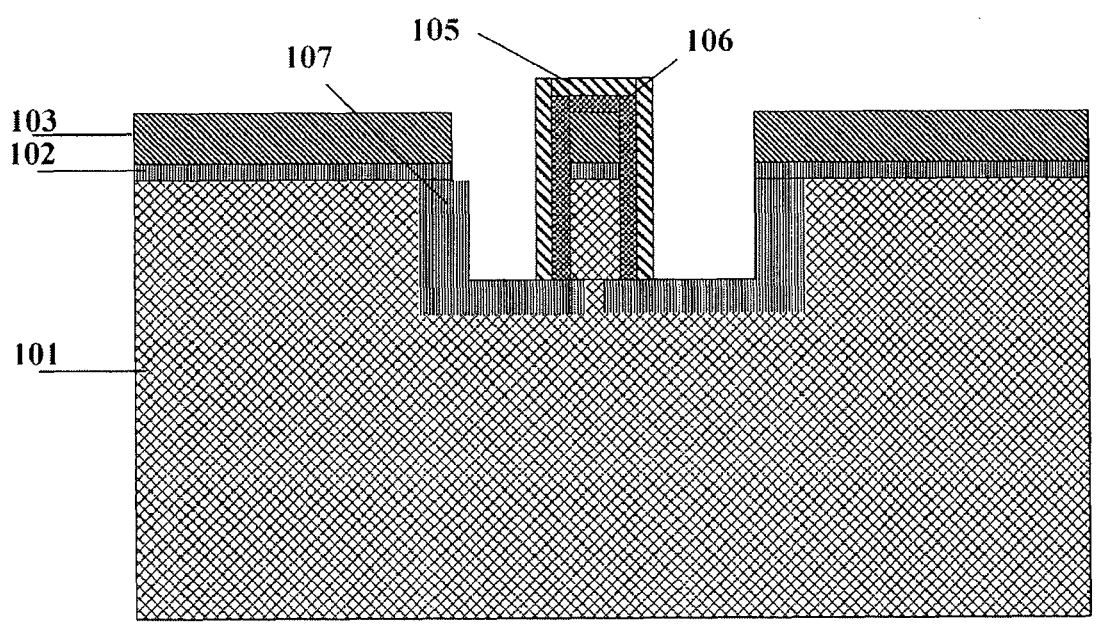

7) As shown in FIG. 1(f), the thickness of dry oxidation is 40-100 nm (107).

Figure 1G:
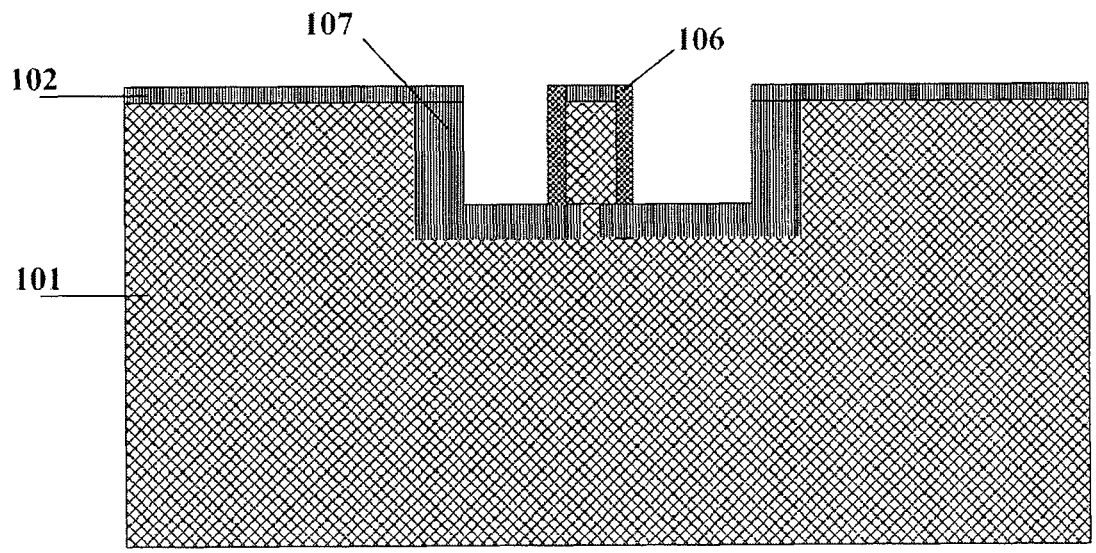

8) As shown in FIG. 1(g), all of the remaining SiN is removed by wet etching, to expose the pre-oxide at bottom.

Figure 1H:
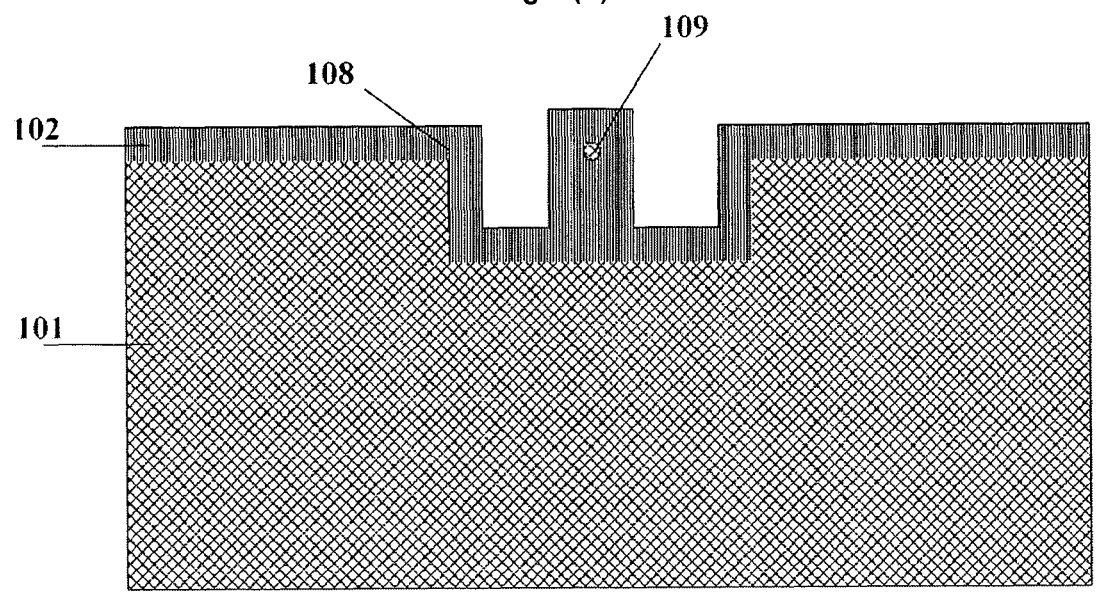

9) As shown in FIG. 1(h), the thickness of the second oxidation is 40 nm (108), and the oxidation is stopped by stress constraint to form the nanowire (109).

Figure 1I:
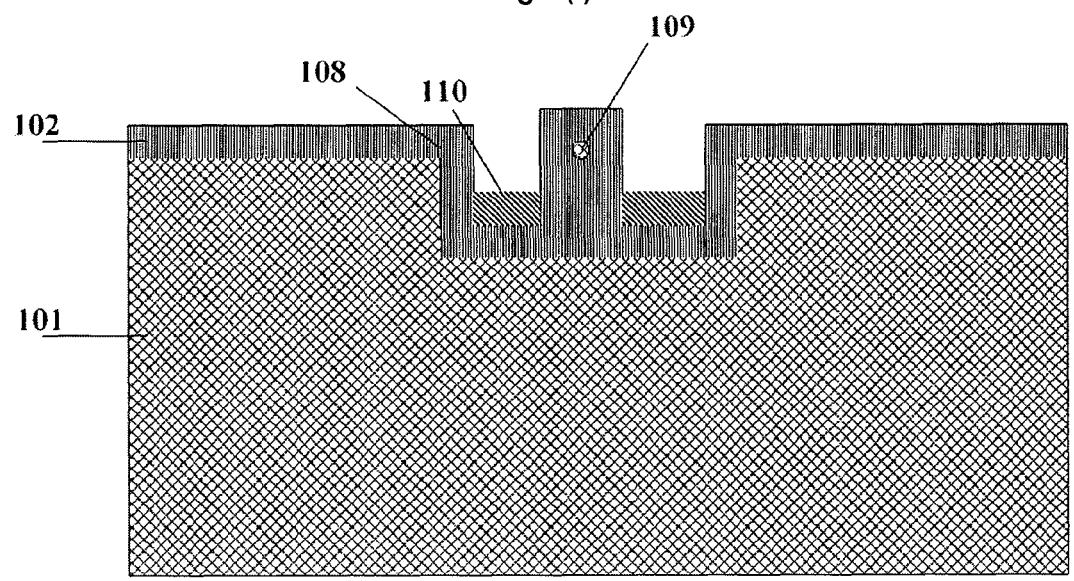

10) As shown in FIG. 1(i), LTO is deposited to a thickness of 300 nm and then anisotropically etched to a depth of 300 nm. Then the surface (110) is planarized.

Figure 1J:
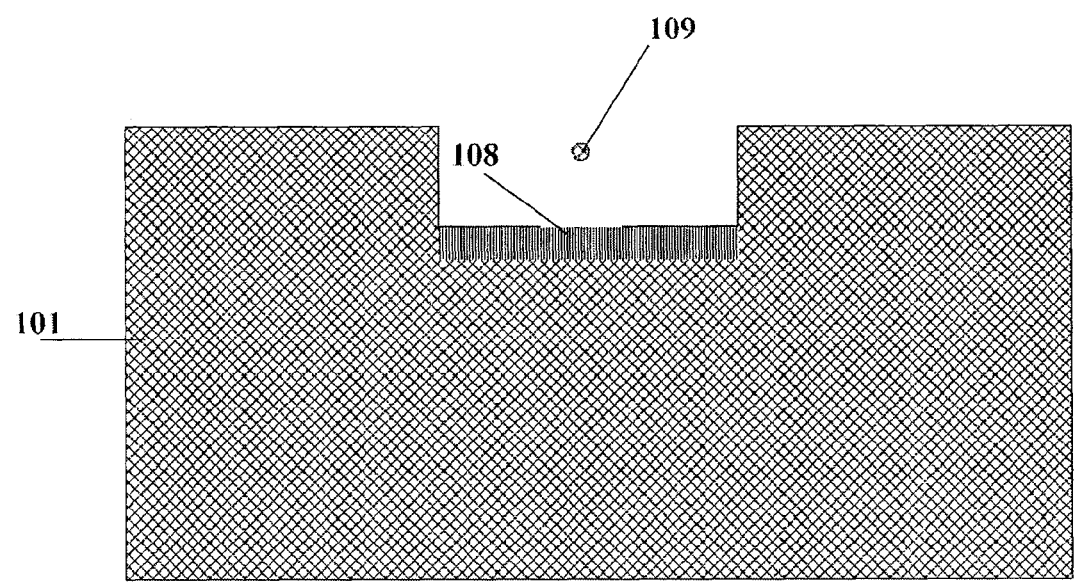
Figure 2:
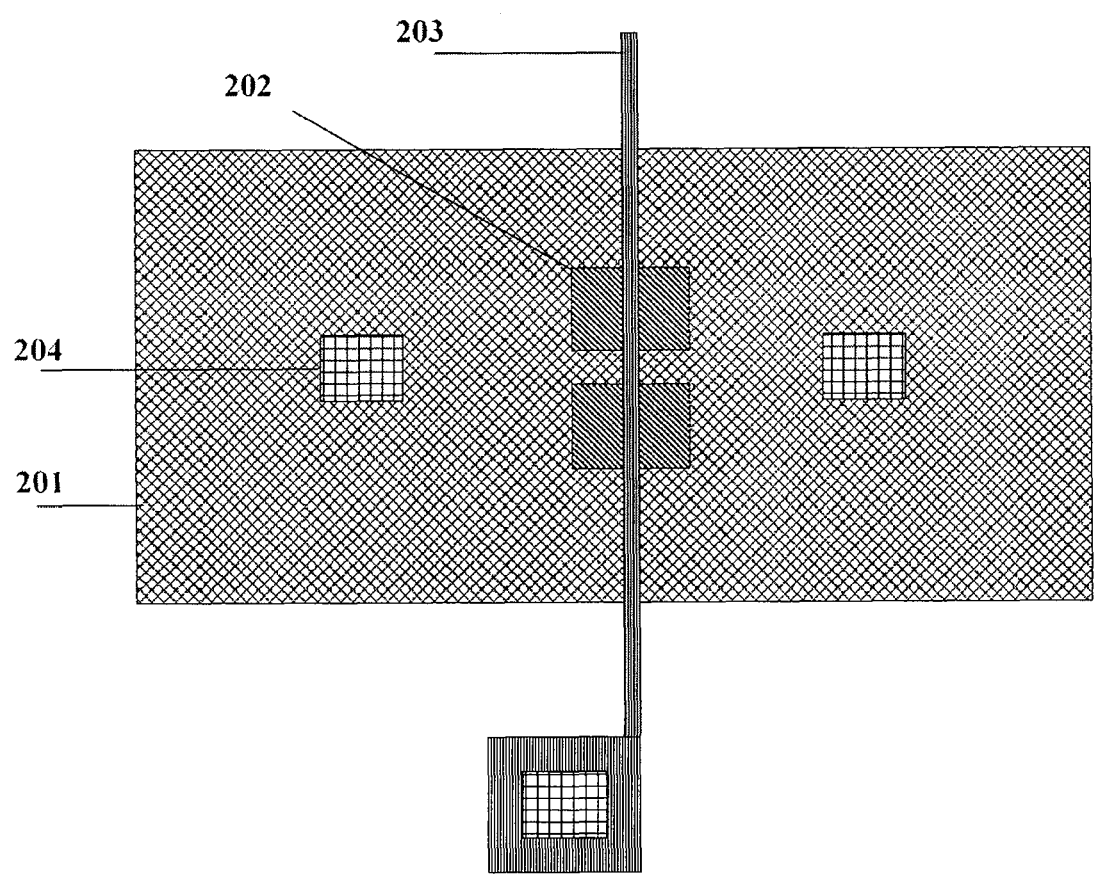
FIG. 2 shows a layout for the flow of the device manufacture process.

11) As shown in FIG. 1(j), the nanowire (109) is released by isotropically etching the $SiO_2$ to a depth of 80 nm.

12) The equivalent oxide layer thickness of the gate oxide dielectric grown by dry oxidation is 30 Å.

13) The polysilicon is grown by Low Pressure Chemical Vapor Deposition (LPCVD), and the thickness of the deposited polysilicon is 1500 Å.

14) Electron beam photolithography is performed on the oxide hard mask, and the oxide layer is used as the hard mask to anisotropically etching the gate material. The lateral depth of etching is 100-200 nm.

15) The gate dielectric layer is used as the hard mask to isotropically etch the gate material, and the lateral depth of etching is 80 nm.

16) The energy for shallow implantation in the source extension region and the drain extension region is 2-6 KeV for As, and 1-6 KeV for B. The dose is (1-8)e14/$cm^3$ for As, and (1-6)e14/$cm^3$ for B.

17) The buffer $SiO_2$ oxide layer is grown to a thickness of 10 nm by dry oxidation. The thickness of the SiN formed by isotropically deposition is 30 nm. The SiN is anisotropically etched to a depth of 30 nm and the pre-oxide is etched to a depth of 10 nm to form the sidewalls.

18) The energy in the deep implantation in the source and drain regions is 10-30 KeV for As, and 5-15 KeV for B. The dose is 4e15/$cm^3$ for As, and 3e15/$cm^3$ for B.

19) The thickness of the deposited metal nickel Ni is 120-200 Å, and the Ni silicide is formed by two-step Rapid Thermal Anneal (RTA).

20) In metallization, multiple metal layers Ti/TiN/Al—Si/TiN are used, which are etched after photolithography to form lead contact, and then are alloyed at a temperature of 530° C. for 40s.

The nanowire surrounding-gate device and the manufacturing method thereof according to the present invention have been described by specific embodiments. Those skilled in the art will understand that various variations and modifications can be made to the structure of the device of the present What is clamed is:

1. A method for manufacturing a bulk Si nanometer surrounding-gate MOSFET based on a quasi-planar process, including:
1) forming an N well and a P well;
2) performing field region photolithography, field region implantation, and local oxidation isolation or shallow trench isolation;
3) depositing a buffer $SiO_2$ oxide layer/SiN dielectric layer;
4) performing positive electron beam exposure, and etching the dielectric layer to form slots;
5) depositing a buffer $SiO_2$ oxide layer and SiN, and etching to form sidewalls;
6) isotropically etching Si;
7) performing a first dry oxidation;
8) removing remaining SiN by wet etching;
9) performing a second dry oxidation to form nanowire;
10) depositing and anisotropically etching tetraethyl orthosilicate, or depositing oxide at a low temperature, and then planarizing the surface;
11) performing isotropic wet etching to release the nanowire;
12) depositing a gate dielectric;
13) depositing a gate electrode material;
14) anisotropically etching the gate electrode;
15) isotropically etching the gate electrode;
16) implanting in source and drain extension regions;
17) isotropically depositing SiN and anisotropically etching it to form sidewalls;
18) performing deep implantation in source and drain regions;
19) forming silicide; and
20) performing metalizing.

2. The method according to claim 1, wherein in step 3), the thickness of the deposited buffer $SiO_2$ oxide layer is 5-50 nm, and the thickness of the deposited SiN is 20-800 nm.

3. The method according to claim 1, wherein in step 4), the positive electron beam exposure is performed by using positive electron beam photoresist;
adjacent dielectric slots are etched by fluorin-base reactive ion etching; and
adjacent Si slots are etched by chlorine-base reactive ion etching.

4. The method according to claim 1, wherein in step 5), the thickness of the deposited buffer oxide layer is 5-15 nm, and the thickness of the SiN is 20-80 nm, and they are etched to form the sidewalls.

5. The method according to claim 1, wherein in step 6), the Si is isotropically etched to a depth of 20-80 nm.

6. The method according to claim 1, wherein in step 7), the thickness of dry oxidation is 40-100 nm, and in step 9), the thickness of dry oxidation is 10-60 nm.

7. The method according to claim 1, wherein in step 10), the thickness of the thick tetraethyl orthosilicate that is deposited and anisotropically etched or the oxide that is deposited at the low temperature is 100 nm-2000 nm, then the surface is planarized.

8. The method according to claim 1, wherein in step 12):
the equivalent oxide layer thickness of the gate dielectric is 6-40 Å;
the gate dielectric is SiON, HfON, HfAlO, HfAlON, HfTaO, HfTaON, HfSiO, HfSiON, HfLaO, or HfLaON; and
the gate dielectric layer is formed by low pressure chemical vapor deposition, physical vapor deposition, metal organic chemical vapor deposition or atom layer deposition.

9. The method according to claim 1, wherein in step 13):
the gate electrode material is W, Ti, Ta, Mo, TiN, TaN, HfN, or MoN; and
the gate electrode material is formed by low pressure chemical vapor deposition, metal organic chemical vapor deposition or atom layer deposition, and the thickness thereof is 1000-2000 Å.

10. The method according to claim 1, wherein in step 15), the gate material is isotropically etched with a gate dielectric layer as a hard mask, and the lateral depth of etching is 10-150 nm.

* * * * *